United States Patent
Kiyokawa

Patent Number: 5,961,808
Date of Patent: *Oct. 5, 1999

[54] METAL FILM RESISTOR HAVING FUSE FUNCTION AND METHOD FOR PRODUCING THE SAME

[75] Inventor: Tadashi Kiyokawa, Fukui, Japan

[73] Assignee: Kiyokawa Mekki Kougyo Co., Ltd., Fukui, Japan

[ * ] Notice: This patent is subject to a terminal disclaimer.

[21] Appl. No.: 09/187,065

[22] Filed: Nov. 6, 1998

Related U.S. Application Data

[63] Continuation of application No. PCT/JP94/00739, Feb. 5, 1994, and application No. 08/811,174, Mar. 4, 1997, Pat. No. 5,863,407, which is a division of application No. 08/360,814, Dec. 29, 1994, abandoned.

[30] Foreign Application Priority Data

May 14, 1993 [JP] Japan .................................. 5-113320

[51] Int. Cl.⁶ .............................. C25D 5/54; C25D 5/56; C25D 3/56; C25D 5/50
[52] U.S. Cl. ........................ 205/159; 205/163; 205/167; 205/183; 205/187; 205/258; 205/210; 205/224
[58] Field of Search .................................... 205/159, 163, 205/167, 183, 187, 258, 210, 224

[56] References Cited

U.S. PATENT DOCUMENTS

| | | | |
|---|---|---|---|
| 3,077,442 | 2/1963 | Koretzky | 204/137 |
| 3,327,272 | 6/1967 | Stern | 338/20 |
| 3,401,318 | 9/1968 | Jensen | 317/235 |
| 3,474,305 | 10/1969 | Szupillo | 317/234 |
| 3,808,576 | 4/1974 | Castonguay et al. | 338/309 |
| 4,038,457 | 7/1977 | Kinugasa et al. | 428/411 |
| 4,220,945 | 9/1980 | Kakuhashi et al. | 338/308 |
| 4,331,947 | 5/1982 | Noerholm | 337/159 |
| 4,364,021 | 12/1982 | Levinson | 338/20 |
| 4,371,861 | 2/1983 | Abdelrahman et al. | 338/25 |
| 4,532,186 | 7/1985 | Shibagaki et al. | 428/457 |
| 4,554,219 | 11/1985 | Gamblin | 428/667 |
| 4,804,823 | 2/1989 | Okuda et al. | 219/553 |
| 4,888,574 | 12/1989 | Rice et al. | 338/309 |
| 4,913,784 | 4/1990 | Bogenschutz et al. | 204/29 |

FOREIGN PATENT DOCUMENTS 57-20687 4/1982 Japan .

*Primary Examiner*—Kathryn Gorgos
*Assistant Examiner*—Edna Wong
*Attorney, Agent, or Firm*—Snider & Chao; Ronald R. Snider

[57] ABSTRACT

The present invention relates to an alloy film resistor containing mainly nickel and phosphorus having an excellent fuse function and a method for producing the alloy film resistor. After the conductivity is given to the surface of an electrical insulating substrate such as ceramics by sequentially performing an etching treatment, an activating treatment and an electroless plating treatment to the electrical insulating substrate, an alloy film containing mainly nickel and phosphorus is formed by not an electroless plating process but an electrolytic plating process. By adopting the electrolytic plating process, a film thickness of the formed alloy film of the middle part on the surface of the insulating substrate is thinner than that of the alloy film of the corner or ridge parts on the surface of the insulating substrate, and the thin part of the film thickness serves as a suitable fusing start part when applying an overload.

6 Claims, 2 Drawing Sheets

F I G. 2
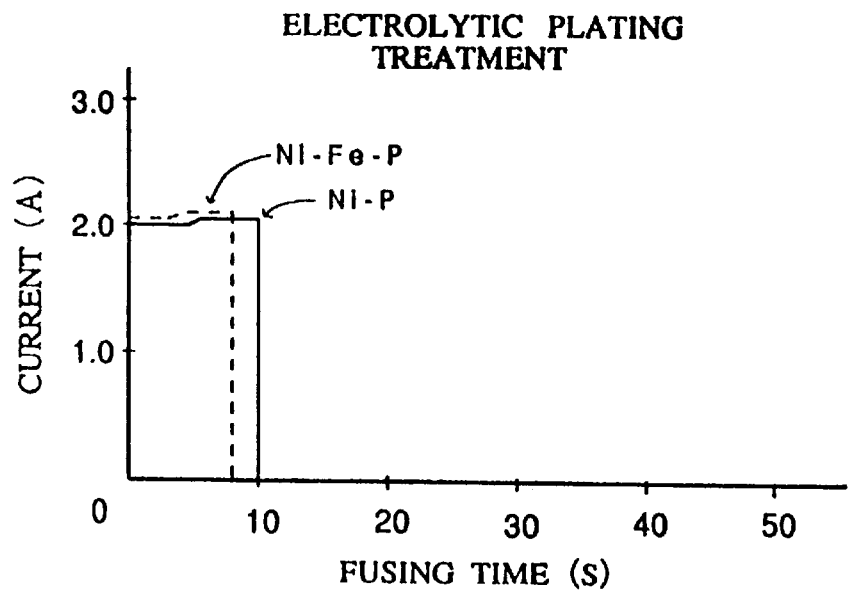
F I G. 3
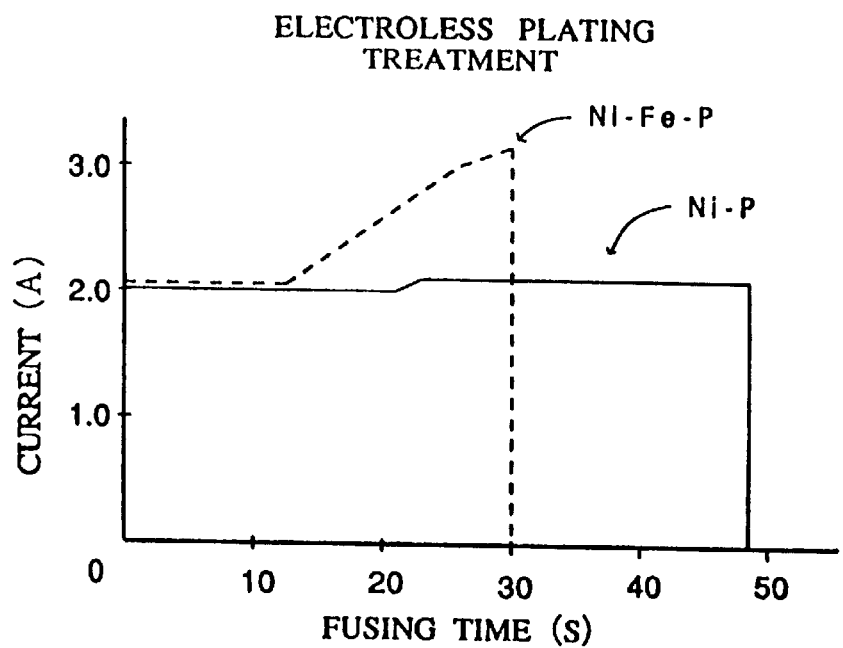

METAL FILM RESISTOR HAVING FUSE FUNCTION AND METHOD FOR PRODUCING THE SAME

This application is a continuation of PCT/JP94/00739 filed Feb. 5, 1994 and of U.S. patent application Ser. No. 08/811,174 filed Mar. 4, 1997, now U.S. Pat. No. 5,863,407 issued on Jan. 26, 1999 which is a divisional of application Ser. No. 08/360,814 filed Dec. 29, 1994, now abandoned.

TECHNICAL FIELD

The present invention relates to an alloy film resistor containing mainly nickel and phosphorus having an excellent fuse function and a method for producing the alloy film resistor.

BACKGROUND ART

Electric resistors which are parts necessary for electric circuits have been widely used for any electrical and electronic equipment. Recently, since precision techniques of electrical and electronic equipment have made progress and also electronic equipment for home and industry has attached importance to the safety, the resistors having a fuse function have been required. That is, the resistors including the fuse function in which when the resistors are normally used, good electrical characteristics in TCR (temperature coefficient of resistance) are shown and when an overload is once applied, a fusing is rapidly performed before the overload badly affects other electronic parts must be obtained.

Conventionally, a nickel-iron-phosphorus metal film obtained by an electroless plating process has been proposed as a resistor having excellent fusing characteristics (Japanese patent publication No.20687 of 1982). It is well known that though a nickel-phosphorus alloy film has the good TCR, the alloy film containing only nickel-phosphorus takes a long time required for fusing and thus an iron is contained as a third component in the above resistor in order to improve the fusing characteristics. However, the iron added as the third component results in the deterioration of the TCR of the alloy film while the addition of the iron to the nickel-phosphorus alloy film allows the fusing time to be reduced surely. That is, in the conventional nickel-phosphorus alloy film resistor, the improvements in both the TCR and the fusing characteristics cannot be attained at the same time, and thus the TCR or the fusing characteristics cannot help deteriorating.

Accordingly, it is an object of the present invention to provide a nickel-phosphorus alloy film resistor having excellent fuse characteristics while maintaining low TCR (temperature coefficient of resistance) characteristics even if a third component such as iron is not contained and a method for producing the alloy film resistor.

It is another object of the present invention to provide a nickel-iron-phosphorus alloy film resistor in which a phenomenon of the increase in current occurs little, which in the case of a nickel-iron-phosphorus alloy film resistor formed by a conventional electroless plating process, it characteristically occurs immediately before the fusing, and to provide a method for producing the alloy film resistor.

DISCLOSURE OF THE INVENTION

The present invention adopts processing means in which after the conductivity is given to the surface of an electrical insulating substrate such as ceramics by sequentially performing an etching treatment, an activating treatment and an electroless plating treatment to the electrical insulating substrate, a nickel-phosphorus alloy film or a nickel-iron-phosphorus alloy film is formed by an electrochemical treatment using not an electroless plating process but an electrolytic plating process. Since the electrolytic plating process is used, a film thickness of the alloy film in the proximity of the middle part on the surface of the insulating substrate is thinner than that of the alloy film of the corner or ridge parts on the surface of the insulating substrate, and the thin part of the film thickness serves as a suitable fusing start part when applying an overload.

BRIEF DESCRIPTION OF THE DRAWINGS

FIG. 2 is a fusing characteristic illustration of the nickel-phosphorus alloy film resistor according to the present invention; and FIG. 3 is a fusing characteristic illustration of the nickel-phosphorus alloy film resistor obtained by a conventional electroless plating process.

BEST MODE FOR CARRYING OUT THE INVENTION

Figure 1:
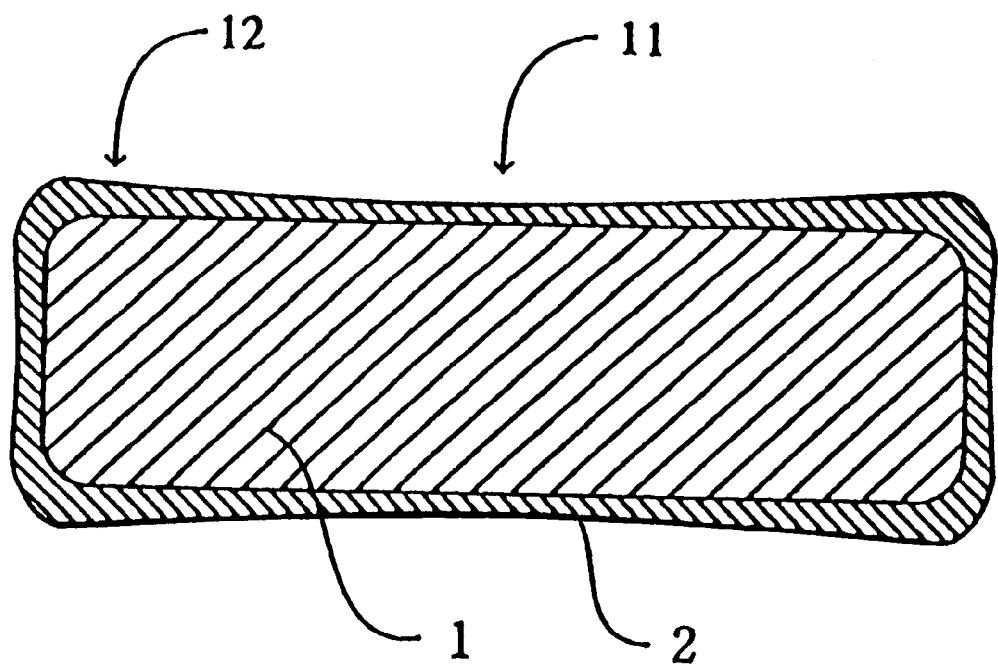
FIG. 1 is a sectional view illustrating a nickel-phosphorus alloy film resistor according to the present invention.

The present invention will be described in detail by way of first to fourth embodiments below.

First Embodiment

First, a ceramic substrate 1 (outer diameter of 4.5 mm and length of 14.0 mm) was dipped into an etching solution containing hydrofluoric acid and nitric acid or an etching solution containing only hydrofluoric acid and an etching treatment was performed, and then a sensitizing treatment was performed by dipping the ceramic substrate 1 into a sensitizing solution containing stannous chloride and hydrochloric acid, and further an activating treatment was performed by dipping the ceramic substrate 1 into an activating solution containing palladium chloride and hydrochloric acid. Then, a nickel-phosphorus alloy plating treatment was performed as a priming plating by an electroless plating process and the conductivity was given to the ceramic substrate 1.

The ceramic substrate 1 pretreated by the above normal manner was dipped into a plating solution with a solution temperature of 50° C. and a pH of 1.5 containing 0.571 mol/l of nickel (obtained by using nickel sulfate), 0.337 mol/l of nickel (obtained by using nickel chloride), 0.204 mol/l of phosphoric acid, 0.244 mol/l of phosphorous acid, and 0.647 mol/l of boric acid (buffer agent), and an electrolytic plating treatment was performed for 540 minutes at a current density of 0.5 A/dm$^2$. As a result, a nickel-phosphorus alloy film 2 consisting of 87 wt % of nickel and 13 wt % of phosphorus was formed on the surface of the ceramic substrate 1. A film thickness of the middle part 11 on the column surface of the ceramic substrate 1 was 20 µm and a film thickness of both end parts 12 on the column surface was 38 µm.

After performing a heat treatment for 180 minutes at a temperature of 210° C., an end capping, a groove cutting and a protective coating were sequentially performed to a resistor, and a nickel-phosphorus alloy film resistor with a resistance value of 40 mΩ, an electric capacity of 2 W and a TCR (temperature coefficient of resistance) of 50 ppm/° C. was produced.

Second Embodiment

A ceramic substrate 1 to which the conductivity was given by performing the same pretreatment as the first embodiment was dipped into a plating solution with a solution temperature of 50° C. and a pH of 1.5 containing 1.394 mol/l of nickel (obtained by using nickel sulfamate), 0.021 mol/l of nickel (obtained by using nickel chloride), 0.204 mol/l of phosphoric acid, 0.244 mol/l of phosphorous acid, and 0.645 mol/l of boric acid (buffer agent),and an electrolytic plating treatment was performed for 270 minutes at a current density of 1 A/dm². As a result, a nickel-phosphorus alloy film consisting of 89 wt % of nickel and 11 wt % of phosphorus was formed on the surface of the ceramic substrate 1. A film thickness of the middle part 11 on the column surface of the ceramic substrate 1 was 12 μm and a film thickness of both end parts 12 on the column surface was 22 μm.

After performing a heat treatment for 180 minutes at a temperature of 210° C., an end capping, a groove cutting and a protective coating were sequentially performed to a resistor, and a nickel-phosphorus alloy film resistor with a resistance value of 100 mΩ, an electric capacity of 2 W and a TCR (temperature coefficient of resistance) of 65 ppm/° C. was produced.

Third Embodiment

A ceramic substrate 1 to which the conductivity was given by performing the same pretreatment as the first embodiment was dipped into a plating solution with a solution temperature of 50° C. and a pH of 1.5 containing 0.571 mol/l of nickel (obtained by using nickel sulfate), 0.337 mol/l of nickel (obtained by using nickel chloride), 0.164 mol/l of iron (obtained by using ferrous sulfate), 0.204 mol/l of phosphoric acid, 0.244 mol/l of phosphorous acid, and 0.484 mol/l of boric acid (buffer agent), and an electrolytic plating treatment was performed for 540 minutes at a current density of 0.5 A/dm². As a result, a nickel-iron-phosphorus alloy film consisting of 87 wt % of nickel, 10 wt % of phosphorus, and 3 wt % of iron was formed on the surface of the ceramic substrate 1. A film thickness of the middle part 11 on the column surface of the ceramic substrate 1 was 16 μm and a film thickness of both end parts 12 on the column surface was 30 μm.

After performing a heat treatment for 180 minutes at a temperature of 210° C., an end capping, a groove cutting and a protective coating were sequentially performed to a resistor, and a nickel-iron-phosphorus alloy film resistor with a resistance value of 66 mΩ, an electric capacity of 2 W and a TCR (temperature coefficient of resistance) of 100 ppm/° C. was produced.

Fourth Embodiment

A ceramic substrate 1 to which the conductivity was given by performing the same pretreatment as the first embodiment was dipped into a plating solution with a solution temperature of 50° C. and a pH of 1.5 containing 1.394 mol/l of nickel (obtained by using nickel sulfamate), 0.021 mol/l of nickel (obtained by using nickel chloride), 0.164 mol/l of iron (obtained by using ferrous sulfate), 0.204 mol/l of phosphoric acid, 0.244 mol/l of phosphorous acid, and 0.645 mol/l of boric acid (buffer agent), and an electrolytic plating treatment was performed for 270 minutes at a current density of 1 A/dm². As a result, a nickel-iron-phosphorus alloy film consisting of 88 wt % of nickel, 9 wt % of phosphorus, and 3 wt % of iron was formed on the surface of the ceramic substrate 1. A film thickness of the middle part 11 on the column surface of the ceramic substrate 1 was 9 μm and a film thickness of both end parts 12 on the column surface was 15 μm.

After performing a heat treatment for 180 minutes at a temperature of 210° C., an end capping, a groove cutting and a protective coating were sequentially performed to a resistor, and a nickel-iron-phosphorus alloy film resistor with a resistance value of 150 mΩ, an electric capacity of 2 W and a TCR (temperature coefficient of resistance) of 125 ppm/° C. was produced.

As described in the above embodiments, the nickel-phosphorus alloy film is formed by the electrolytic plating process in the present invention. Thus, the film thickness of the corner and ridge parts of the ceramic substrate 1 is thicker than that of the other parts due to the variation in current density of plating in a plating bath. Though such an unevenness of an electrodeposition is not preferable in fields using the electrolytic plating process, the present invention positively utilizes the unevenness of the electrodeposition making a complete about-face of idea. When the electrolytic plating treatment as stated in the above embodiments is performed on the ceramic substrate 1 having the column shape, the film thickness in the proximity of the middle part 11 on the column surface (see FIG. 1) is thinnest. The thin part of the film thickness suitably triggers a fusing start. Also, the middle part 11 on the column surface is used as a part of the groove cutting for adjusting the resistance value and the groove cutting can be facilitated since the film thickness of the middle part 11 is thin.

Fusing Test

A result of a fusing test examined in a nickel-phosphorus alloy film resistor obtained by the above embodiments is shown in FIG. 2. Also, a fusing result of a nickel-phosphorus alloy film resistor obtained by a conventional electroless plating process is shown in FIG. 3.

In FIG. 2, using a nickel-phosphorus alloy film resistor (outer diameter of 4.5 mm and length of 14.0 mm) with an electric capacity of 2 W according to the first embodiment and a nickel-iron-phosphorus alloy film resistor according to the third embodiment, the time required to break the resistors completely by continuously applying a DC voltage 15 times a rated power to the resistors respectively is indicated together with the change of current.

As seen from the comparison between FIG. 2 and FIG. 3, even if the voltage applied as an abnormal voltage is 15 times the rated power and is lower than the general abnormal voltage in the nickel-phosphorus alloy film resistor and the nickel-iron-phosphorus alloy film resistor of the present invention, the fusing time is remarkably reduced compared with a conventional resistor and an electric circuit is not affected badly. Further, any electrical and electronic equipment attaching importance to a phenomenon of the increase in current (1.6 to 2.5 times a rated current) immediately before the fusing generally observed in the nickel-iron-phosphorus alloy film resistor by the conventional electroless plating process occurs little, and the electric circuit is not affected badly even for a moment.

As mentioned above, since the nickel-phosphorus alloy film having a locally thin part is positively formed by using an electrolytic plating process in the nickel-phosphorus alloy film resistor according to the present invention, the fusing is easily started in the thin part of the film thickness when applying an overload. Accordingly, since it does not require that a third component such as iron is contained in the alloy film, the nickel-phosphorus alloy film resistor in which the deterioration of a TCR (temperature coefficient of resistance) does not occur and also the fusing is speedily performed without almost phenomenalizing the increase in current immediately before the fusing can be provided. Further, if the iron is additionally contained using a method according to the present invention, the time required to fuse the resistor completely is more reduced as shown in FIG. 2 though the TCR becomes slightly sacrificed.

INDUSTRIAL APPLICABILITY

As described above, a metal film resistor having a fuse function according to the present invention has remarkably good fusing characteristics when applying an overload while ensuring an excellent TCR (temperature coefficient of resistance) and thus the metal film resistor is useful for resistors used in any electrical and electronic equipment attaching importance to the safety, particularly, is the most suitable for precision resistors employed in various precision measuring instruments.

Also, since a method for producing the metal film resistor having the fuse function according to the present invention utilizes an electrolytic plating process, a film proportional to current value and time can be formed though some bath control is required. By adjusting the current value or the like, the resistor ranging from low resistance region (0.02 Ω or less) to high resistance region (1 Ω or more) can be formed, and the method according to the present invention is extremely useful as the method for producing the nickel-phosphorus alloy film resistor having a desired resistance value with both electrical characteristics such as TCR and fusing characteristics.

I claim:

1. A method of producing a metal film resistor having a fuse function, comprising the steps of:

imparting conductivity to a surface of an electrically insulating substrate by:

sequentially performing an etching treatment, performing an activating treatment, performing an electroless plating treatment to the electrically insulating substrate, forming a film of a nickel-phosphorous alloy on the electrically insulating substrate by an electrolytic plating treatment, which is conducted so that said film has a thickness in edge parts which is greater than that of other thinner parts of the film to provide a fusing function in the other thinner parts, and performing a heat ageing treatment on the film of a nickel-phosphorous alloy and the electrically insulating substrate.

2. A method in accordance with claim 1 wherein said insulating substrate is a ceramic substrate.

3. A method of producing a metal film resistor having a fuse function, consisting of the steps of:

imparting conductivity to a surface of an electrically insulating substrate by:

sequentially performing an etching treatment, performing an activating treatment, performing an electroless plating treatment to the electrically insulating substrate, and forming a film of a nickel-phosphorous alloy on the electrically insulating substrate by an electrolytic plating treatment, which is conducted so that said film has a thickness in edge parts which is greater than that of other thinner parts of the film to provide a fusing function in the other thinner parts.

4. The method in accordance with claim 3 further consisting of the step of performing a heat ageing treatment on the film of a nickel-phosphorous alloy and the electrically insulating substrate.

5. A method in accordance with claim 4 wherein said insulating substrate is a ceramic substrate.

6. A method in accordance with claim 3 wherein said insulating substrate is a ceramic substrate.

* * * * *